United States Patent [19]

Geller et al.

[11] 4,306,224

[45] Dec. 15, 1981

[54] ANALOG-TO-DIGITAL CONVERTING APPARATUS

[75] Inventors: William L. Geller; Richard L. Naugle, both of Framingham, Mass.

[73] Assignee: GTE Laboratories Incorporated, Waltham, Mass.

[21] Appl. No.: 189,422

[22] Filed: Sep. 22, 1980

[51] Int. Cl.$^3$ .......................................... H03K 13/175
[52] U.S. Cl. ........................................... 340/347 AD
[58] Field of Search .................. 340/347 AD, 347 M; 235/310; 324/99 D; 358/13

[56] References Cited

U.S. PATENT DOCUMENTS

| | | | |
|---|---|---|---|
| 3,100,298 | 8/1963 | Fluhr | 340/347 AD |
| 3,585,631 | 6/1971 | McCown | 340/347 AD |
| 3,858,200 | 12/1974 | Henry | 340/347 AD |
| 3,968,486 | 7/1976 | Gerdes | 340/347 AD |
| 4,099,173 | 7/1978 | Zeskind | 340/347 AD |

OTHER PUBLICATIONS

Trinko, "Electronic Design", vol. 17, No. 9, Apr. 26, 1969, pp. 74, 76.
Hartley, "Electronics", Feb. 5, 1976, pp. 92-93.
Mokhoff, "Electronics", May 10, 1979, pp. 105-116.

Primary Examiner—Charles D. Miller
Attorney, Agent, or Firm—David M. Keay

[57] ABSTRACT

An analog-to-digital converting apparatus having a plurality of stages arranged in series, each stage including a comparator. The positive input terminals of all the comparators are connected in common to the analog signal input terminal. The negative input terminal of the first comparator in the series is connected to a reference voltage equal to the mid-point of the voltage range of the analog input signals. Each stage except the last has a resistance connected between the negative input terminal of its comparator and that of the next comparator in the series. Constant current sources, of equal value in each stage, are connected to each end of the resistance and through a current switch to a constant current sink. The current switch is conrolled by the output of the comparator of the stage so that a constant current flows through the resistance in one direction or the other, increasing or decreasing the voltage at the negative input terminal of the next comparator in the series. The values of resistances and constant currents are selected so that the voltage drop across the resistance of each stage is one-half that of the previous stage. The outputs of the comparators are periodically stored in latches, and the outputs of the latches provide a digital output signal corresponding to the amplitude of the analog input signal.

7 Claims, 2 Drawing Figures

ANALOG-TO-DIGITAL CONVERTING APPARATUS

CROSS-REFERENCE TO RELATED APPLICATIONS

This application is related to application Ser. No. 189,423 filed concurrently herewith by William L. Geller and Richard Naugle entitled "Digital-to-Analog Converting Apparatus" and assigned to the assignee of the present application.

BACKGROUND OF THE INVENTION

This invention relates to apparatus for converting analog signals to digital signals. More particularly, it is concerned with analog-to-digital converting apparatus employing successive approximation techniques.

Various types of analog-to-digital converting apparatus are well-known and widely used. Many types require circuitry to sample the amplitude of an analog signal and then hold the sample during a conversion process. The conversion process may require that a comparison step be made in succession to determine each bit of the digital output. This type of converter utilizes a single comparator. With such apparatus the total conversion time which is the sum of the delays for each comparison step may be excessive for certain applications. Another type of analog-to-digital converter employs a comparator for each quantum of voltage of the analog signal which is to be converted. The outputs of the comparators are then decoded by decoding logic. Although such a converter operates at very high speed, a large number of comparators and appropriate decoding logic are required.

SUMMARY OF THE INVENTION

Analog-to-digital converting apparatus in accordance with the present invention is relatively simple and operates at reasonably high speed. The apparatus includes a plurality of N stages, equal to the number of digital output bits, arranged in series. Each stage includes a comparator means having a first input terminal connected to a signal input terminal which receives the analog input signal, a second input terminal, and an output terminal. Each comparator means produces a first output condition at its output terminal when the voltage at one of the input terminals is greater than that at the other, and produces a second output condition at its output terminal when the voltage at the other of the input terminals is greater than that at the one input terminal. A source of reference voltage is connected to the second input terminal of the comparator means of the first stage in the series.

Each of the stages except for the last stage in the series includes a resistance means, first and second constant current means, and a switching means. Each resistance means is connected between the second input terminal of the associated comparator means and the second input terminal of the next comparator means in the series. Each first constant current means produces a constant current and is connected to the juncture of the associated resistance means and the second input terminal of the associated comparator means. Each second constant current means produces a constant current equal to the constant current produced by the associated first constant current means and is connected to the juncture of the associated resistance means and the second input terminal of the next comparator means in the series. Each switching means is coupled to the output terminal of the associated comparator means, the associated first and second constant current means, and the associated resistance means. Each switching means is operable when the associated comparator means is producing the first output condition to provide a path for current from the first constant current means bypassing the associated resistance means, and to provide a path for current from the second constant current means flowing through the associated resistance means in the direction from the second input terminal of the next comparator means in the series toward the second input terminal of the associated comparator means, whereby the voltage at the second input terminal of the next comparator means in the series is greater than that at the second input terminal of the associated comparator means by the voltage drop across the associated resistance means. Each switching means is operable when the associated comparator means is producing the second output condition to provide a path for current from the second constant current means bypassing the associated resistance means, and to provide a path for current from the first constant current means flowing through the associated resistance means in the direction from the second input terminal of the comparator means toward the second input terminal of the next comparator means in the series, whereby the voltage at the second input terminal of the next comparator means in the series is less than that at the second input terminal of the associated comparator means by the voltage drop across the associated resistance means. Thus, the output conditions of all the comparator means in the series provides a digital representation corresponding to the analog input signal.

For a better understanding of the present invention, together with other and further objects, advantages, and capabilities thereof, reference is made to the following disclosure and appended claims in connection with the above-described drawings.

DETAILED DESCRIPTION OF THE INVENTION

Figure 1:
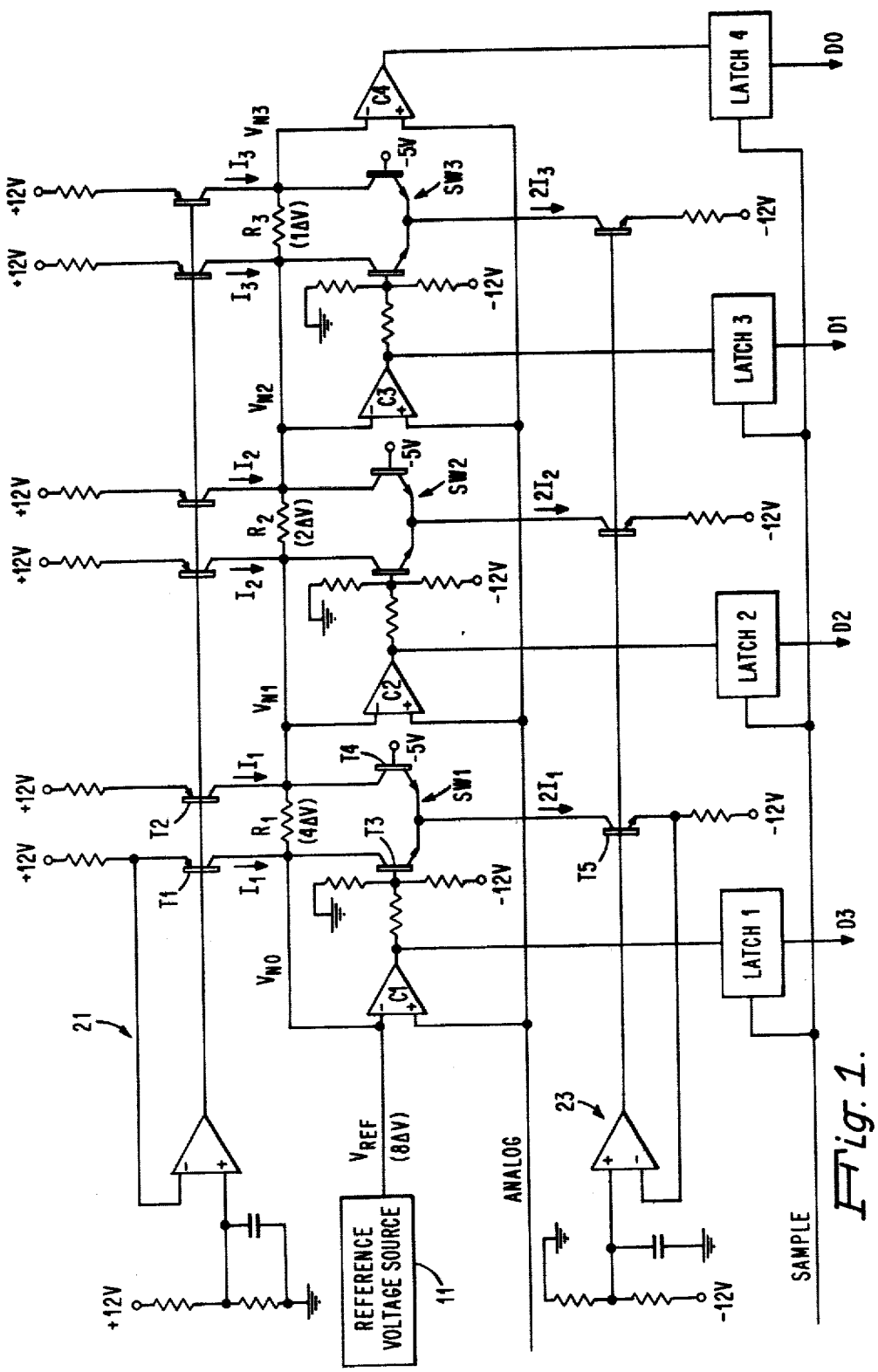
FIG. 1 is a schematic circuit diagram of analog-to-digital converting apparatus in accordance with the present invention.

FIG. 1 is a schematic circuit diagram of an exemplary analog-to-digital converter in accordance with the present invention for converting an analog input signal to a four-bit digital output signal. The apparatus as shown has four stages arranged in series. Each stage includes a comparator C1, C2, C3, and C4. The positive inputs are connected together and to an ANALOG signal input terminal. A reference voltage source 11 produces a reference voltage $V_{REF}$ which is applied to the negative input terminal of the comparator C1 of the first stage in the series. This terminal is connected through a resistance $R_1$ to the negative input terminal of the next comparator C2 in the series. This terminal is connected through a resistance $R_2$ to the negative input terminal of comparator C3 of the third stage in the series, and this terminal is connected through a resistance $R_3$ to the negative input terminal of the fourth comparator C4.

For purposes of explaining the operation of the illustrated apparatus, the negative input terminals of the comparators C1–C4 are labeled as voltage nodes VN0–VN3, respectively.

Two constant current sources including transistors T1 and T2 are connected to opposite ends of the resistance $R_1$ of the first stage. Current flow through the transistors is controlled by a conventional arrangement 21. Equal constant currents $I_1$ flow through each transistor T1 and T2. Transistors T1 and T2 are connected directly to transistors T3 and T4, respectively, of a transistor switching arrangement SW1 which is controlled by the output of comparator C1. The currents through transistors T3 and T4 are combined to a current $2I_1$ which passes through a constant current sink including transistor T5 which is controlled by a conventional arrangement 23.

The second stage which includes comparator C2 and resistance $R_2$ also includes two constant current sources which produce equal constant currents $I_2$, a transistor switching arrangement SW2, and a constant current sink for a constant current of $2I_2$. The third stage includes a similar circuit arrangement of comparator C3, resistance $R_3$, two constant current sources producing equal currents $I_3$, a transistor switching arrangement SW3, and a constant current sink for a constant current of $2I_3$. The fourth stage includes comparator C4.

The output of each comparator C1–C4 is also applied to a corresponding latch, latch 1-latch 4, respectively, which may be a conventional D-type flip-flop. The latches are triggered periodically to sample the outputs of the comparators by a SAMPLE signal. The outputs of the latches labeled D3, D2, D1, and D0 provide a digital representation of the analog input signal.

The first stage operates in the following manner in comparing the voltage of the ANALOG input signal at the positive input terminal of the comparator C1 with the reference voltage $V_{REF}$ at the negative input terminal of the comparator C1. When the voltage at the positive input terminal is greater than that at the negative input terminal, the output of comparator C1 is positive, +5 volts in the specific embodiment illustrated. Thus, transistor T3 of the transistor switch SW1 is biased to a low impedance condition and transistor T4 is biased to a high impedance condition. Under these conditions the constant current $I_1$ flowing through constant current transistor T1 flows directly through switching transistor T3 and does not pass through resistance $R_1$. The constant current $I_1$ flowing through constant current transistor T2 flows through resistance $R_1$ and switching transistor T3. The combined current $2I_1$ from transistor T3 flows through the constant current sink transistor T5. By virtue of the flow of constant current $I_1$ in the direction from node VN1 to node VN0, the voltage at node VN1 is greater than the reference voltage $V_{REF}$ at node VN0 by the voltage drop $I_1R_1$ across the resistance $R_1$.

When the reference voltage $V_{REF}$ at its negative input terminal is greater than the ANALOG input voltage at its positive input terminal, the output of comparator C1 is considered negative, specifically 0 volts in the embodiment illustrated, this voltage biases switching transistor T3 of the transistor switch SW1 to a high impedance condition and switching transistor T4 to a low impedance condition. The constant currents $I_1$ from both constant current transistors T1 and T2 flow through switching transistor T4. The current from transistor T1 flows through resistance $R_1$ while that from transistor T2 bypasses resistance $R_1$. Since the current $I_1$ flows in the direction from node VN0 to node VN1, the voltage at node VN1 is lower than the reference voltage $V_{REF}$ at node VN0 by the voltage drop $I_1R_1$ across resistance $R_1$.

The exemplary apparatus as illustrated in FIG. 1 converts the amplitude of an ANALOG input signal to a four-bit digital signal D3–D0. Thus, there are sixteen voltage steps $\Delta V$ over the full range of voltage of ANALOG input signals to be detected. In general, for apparatus having N digital outputs and N stages the total number of voltage steps over the full range of input voltage is $2^N$, or the full voltage range equals $2^N \Delta V$. The reference voltage $V_{REF}$ is equal to the midpoint of the ANALOG signal voltage range. Assuming the minimum ANALOG voltage to be zero, the reference voltage $V_{REF}$ may be expressed as $2^N \Delta V/2$, which in the present specific embodiment is $8 \Delta V$.

The values of constant current $I_1$ and resistance $R_1$ are selected so that the voltage drop $I_1R_1$ across resistance $R_1$ is equal to one-quarter of the full range of ANALOG input voltages, specifically $4 \Delta V$. The values of constant current $I_2$ and resistance $R_2$ are selected so that the voltage drop $I_2R_2$ across resistance $R_2$ is one-eighth of the full range of ANALOG input voltages, specifically $2 \Delta V$, and constant current $I_3$ and resistance $R_3$ are selected to provide a voltage drop $I_3R_3$ across resistance $R_3$ of one-sixteenth of the full range of ANALOG input voltages, specifically $1 \Delta V$. Thus, the voltage drop $I_nR_n$ across the resistance $R_n$ of a stage in the series, where n is the numerical position of the stage in the series of N stages, may be expressed as $2^N \Delta V/2^{n+1}$.

Figure 2:
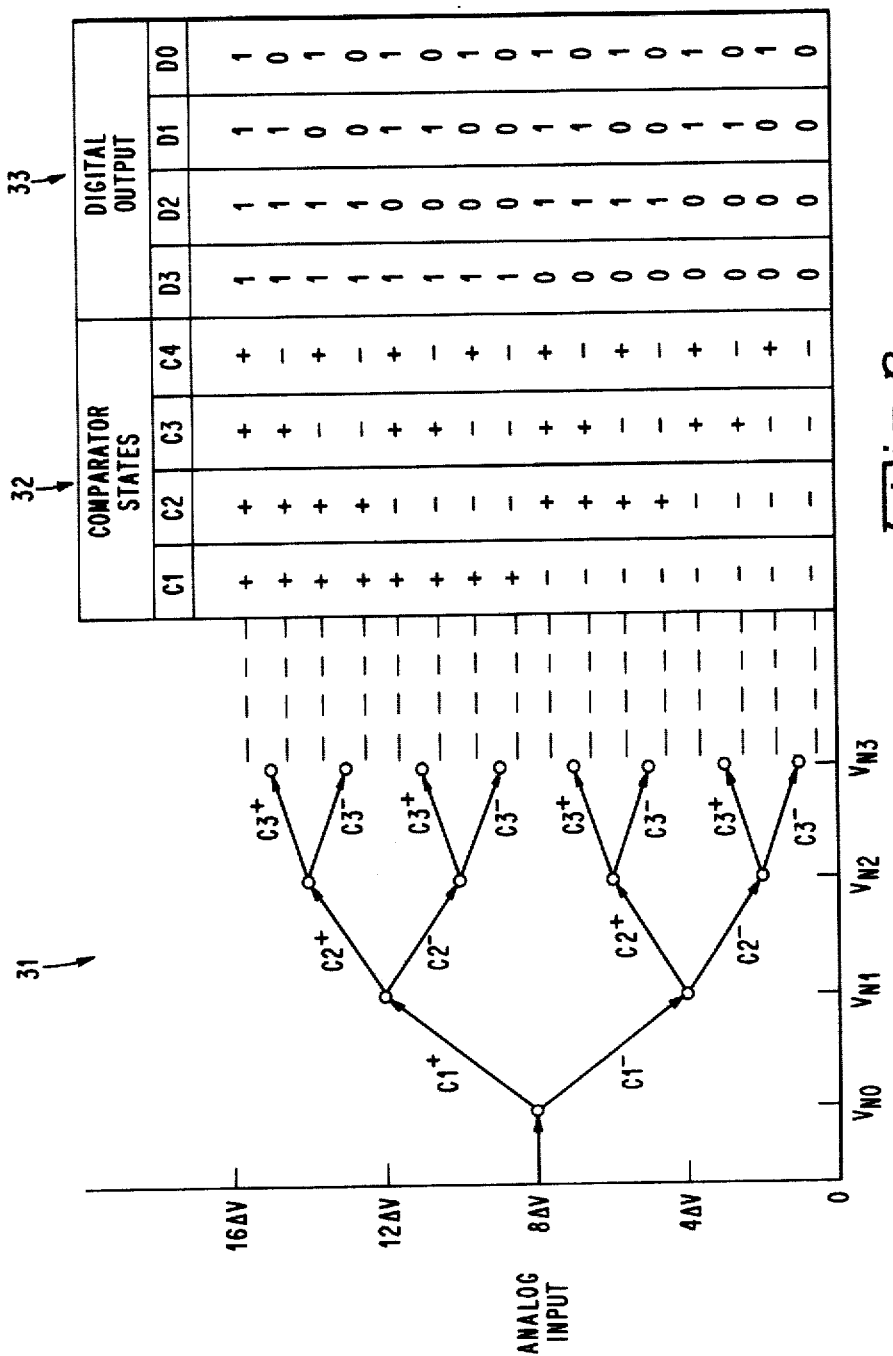
FIG. 2 is a diagram useful in explaining the operation of the apparatus of FIG. 1.

FIG. 2 is a diagram indicating the operating conditions of elements of the apparatus of FIG. 1 in response to analog input signals of every amplitude within the range $16 \Delta V$. The first portion 31 is a binary tree illustrating the possible pattern of voltages at the voltage nodes VN0–VN3. The second portion 32 illustrates the output stages of the comparators C1–C4 for each possible set of conditions, and the third portion 33 indicates the resulting digital output signals of the latches, latch 1-4.

The voltage at the first node VN0, the negative input terminal of the first comparator C1, is fixed by the reference voltage source 11, at $8 \Delta V$. The amplitude of the instantaneous ANALOG input signal is compared with this voltage, and if greater the output of comparator C1 becomes positive causing transistor T3 to conduct. The current $I_1$ from transistor T2 flows through resistance $R_1$ thereby increasing the voltage at the second node VN1 over that at the first node VN0 to $4 \Delta V$ to $12 \Delta V$ as illustrated in the first portion 31 of FIG. 2. If the amplitude of the instantaneous ANALOG signal is less than the reference voltage of $8 \Delta V$, the output of comparator C1 is negative and switching transistor T4 conducts. Current $I_1$ from transistor T1 flows through resistance $R_1$ decreasing the voltage at the second node VN1 over that at the first node VN0 by $4 \Delta V$ to $4 \Delta V$ as illustrated in the first portion 31 of FIG. 2.

Comparator C2 compares the amplitude of the ANALOG input signal with the voltage at node VN1, the negative input terminal of the comparator C2. As indicated in the first portion 31 of FIG. 2, the voltage at node VN1 is either $4 \Delta V$ or $12 \Delta V$. Depending upon whether the ANALOG voltage is greater or less than the voltage at node VN1 the output of the comparator C2 is positive or negative as illustrated by the second portion 32 of FIG. 2. The output signal from comparator C2 causes one of the two transistors of the switching arrangement SW2 to conduct causing a current $I_2$ to flow through resistance $R_2$. Depending upon the direction of current flow, as determined by the output of comparator C2, the $I_2R_2$ voltage drop produces a voltage at node VN2 which is either greater or less than that at node VN1 by 2 $\Delta V$. In the third stage comparator C3 operates in a similar manner to compare the amplitude of the ANALOG input signal to the voltage at node VN2, the negative input terminal of the comparator C3. The various possibilities of comparator output and resulting voltage produced at node VN3 by the polarity of the $I_3R_3$ voltage drop of 1 $\Delta V$ across resistance $R_3$ are indicated in FIG. 2. Comparator C4 of the fourth and last stage compares the amplitude of the ANALOG input signal to the voltage at node VN3 and produces an appropriate output signal as illustrated in FIG. 2.

The outputs of the comparators C1–C4 are sampled and stored in the latches, latch 1–latch 4, respectively. The outputs of the individual latches are logic 1's or logic 0's depending upon the output conditions of the associated comparators as indicated in FIG. 2. Thus, the instantaneous amplitude of the ANALOG input signal is converted into a four-bit digital signal D3–D0, D3 being the most significant bit and D0 the least significant bit.

The apparatus as described readily may be expanded to any number of stages N to provide resolution of the full range of analog voltages into $2^N$ voltage steps. The combination of values of constant currents and resistances as described provide a linear binary conversion of analog signals to digital signals. By appropriate selection of these parameters a non-linear, for example logarithmic, relationship could be provided between the analog and digital signals.

Analog-to-digital converting apparatus in accordance with the invention does not require sample-and-hold circuitry for the analog signal and no clock signals are required to control the conversion procedure. Total delay for conversion depends only on the sum of the delays for the N stages. The use of two constant current sources and a constant current sink of value equal to the sum of the two sources in each of the stages except the last assures that there is no current flow between stages. The current in each stage, therefore, neither adds to nor subtracts from currents in other stages, thus preventing any adverse effects on the voltages at the voltage nodes.

While there has been shown and described what is considered to be a preferred embodiment of the present invention, it will be obvious to those skilled in the art that various changes and modifications may be made therein without departing from the invention as defined by the appended claims.

What is claimed is:

1. Apparatus for converting the amplitude of an analog signal to a digital signal including in combination
   a signal input terminal for receiving an analog input signal;
   a plurality of N stages arranged in series;
   each stage including a comparator means having a first input terminal connected to said signal input terminal, a second input terminal, and an output terminal; each comparator means being operable to produce a first output condition at its output terminal when the voltage at one of the input terminals is greater than that at the other input terminal and to produce a second output condition at its output terminal when the voltage at the other of the input terminals is greater than that at the one input terminal;
   a source of reference voltage connected to the second input terminal of the comparator means of the first stage in the series;
   each stage except the last stage in the series including resistance means connected between the second input terminal of the associated comparator means and the second input terminal of the next comparator means in the series;
   first constant current means for producing a constant current connected to the juncture of the associated resistance means and the second input terminal of the associated comparator means;
   second constant current means for producing a constant current equal to the constant current produced by the associated first constant current means connected to the juncture of the associated resistance means and the second input terminal of the next comparator means in the series;
   switching means coupled to the output terminal of the associated comparator means, the associated first and second constant current means, and the associated resistance means;
   the switching means being operable when the associated comparator means is producing the first output condition to provide a path for current from the first constant current means bypassing the associated resistance means, and to provide a path for current from the second constant current means flowing through the associated resistance means in the direction from the second input terminal of the next comparator means in the series toward the second input terminal of the associated comparator means, whereby the voltage at the second input terminal of the next comparator means in the series is greater than that at the second input terminal of the associated comparator means by the voltage drop across the associated resistance means; and
   the switching means being operable when the associated comparator means is producing the second output condition to provide a path for current from the second constant current means bypassing the associated resistance means, and to provide a path for current from the first constant current means flowing through the associated resistance means in the direction from the second input terminal of the associated comparator means toward the second input terminal of the next comparator means in the series, whereby the voltage at the second input terminal of the next comparator means in the series is less than that at the second input terminal of the associated comparator means by the voltage drop across the associated resistance means;
   whereby the output conditions of the comparator means in the series provide a digital representation corresponding to the analog input signal.

2. Apparatus in accordance with claim 1 wherein
   said source of reference voltage produces a voltage equal to the mid-point of the voltage range of analog input signals to be converted; and
   the voltage drop across each resistance means produced by current flow from an associated constant current means is equal to the voltage range of analog input signals to be converted divided by $2^{n+1}$ where n is the numerical position of the associated stage in the series.

3. Apparatus in accordance with claim 2 wherein each of said stages includes a latching means coupled to the output terminal of the associated comparator means;

and including means for periodically latching all of said latching means to store a representation of the output condition of each comparator means.

4. Apparatus in accordance with claim 1 wherein each of said switching means includes a first switching device connected to the juncture of the associated resistance means and the second input terminal of the associated comparator means, said first switching device being operable to provide a low impedance to current flow therethrough when the associated comparator means produces the first output condition, and being operable to provide a high impedance to current flow therethrough when the associated comparator means produces the second output condition; and a second switching device connected to the juncture of the associated resistance means and the second input terminal of the comparator means next in the series, said second switching device being operable to provide a high impedance to current flow therethrough when the associated comparator means produces the first output condition, and being operable to provide a low impedance to current flow therethrough when the associated comparator means produces the second output condition.

5. Apparatus in accordance with claim 4 wherein each of said stages except the last stage in the series includes a first constant current source means connected to the juncture of the associated resistance means and the second input terminal of the associated comparator means;

a second constant current source means connected to the juncture of the associated resistance means and the second input terminal of the comparator means next in the series; and a constant current sink means connected to the first and second switching devices;

the current flow from the first constant current source means being equal to the current flow from the associated second constant current source means, and the current flow to the associated constant current sink means being equal to the total of the current flow from the associated first and second constant current source means.

6. Apparatus in accordance with claim 5 wherein each of said stage includes a latching means coupled to the output terminal of the associated comparator means;

and including means for periodically latching all of said latching means to store a representation of the output condition of each comparator means.

7. Apparatus in accordance with claim 6 wherein said source of reference voltage produces a voltage equal to the mid-point of the voltage range of analog input signals to be converted; and the voltage drop across each resistance means produced by current flow from an associated constant current means is equal to the voltage range of analog input signals to be converted divided by $2^{n+1}$ where n is the numerical position of the associated stage in the series.

* * * * *